United States Patent
Fulks, III

(10) Patent No.: US 7,906,983 B2
(45) Date of Patent: Mar. 15, 2011

(54) PROGRAMMABLE LOGIC DEVICE HAVING AN EMBEDDED TEST LOGIC WITH SECURE ACCESS CONTROL

(75) Inventor: Charles E. Fulks, III, Madison, AL (US)

(73) Assignee: Intuitive Research and Technology, Huntsville, AL (US)

( * ) Notice: Subject to any disclaimer, the term of this patent is extended or adjusted under 35 U.S.C. 154(b) by 100 days.

(21) Appl. No.: 12/330,264

(22) Filed: Dec. 8, 2008

(65) Prior Publication Data

US 2010/0141295 A1 Jun. 10, 2010

(51) Int. Cl.
*H03K 19/00* (2006.01)
*H03K 19/173* (2006.01)
*G06F 11/30* (2006.01)
*G06F 12/14* (2006.01)

(52) U.S. Cl. ............... 326/8; 326/38; 713/189; 713/193

(58) Field of Classification Search ............... 326/8, 16, 326/37–41, 47; 713/168–191; 380/277–285
See application file for complete search history.

(56) References Cited

U.S. PATENT DOCUMENTS

| | | | |
|---|---|---|---|
| 5,321,704 A | 6/1994 | Erickson et al. | |
| 5,388,157 A | 2/1995 | Austin | |
| 5,705,938 A | 1/1998 | Kean | |
| 5,914,616 A | 6/1999 | Young et al. | |
| 6,654,889 B1* | 11/2003 | Trimberger | 713/191 |
| 6,957,340 B1* | 10/2005 | Pang et al. | 713/189 |
| 6,996,713 B1 | 2/2006 | Trimberger | |
| 7,149,862 B2 | 12/2006 | Tune et al. | |
| 7,162,644 B1 | 1/2007 | Trimberger | |
| 7,219,237 B1* | 5/2007 | Trimberger | 713/193 |
| 7,313,739 B2 | 12/2007 | Menon et al. | |
| 7,363,564 B2 | 4/2008 | Moss et al. | |
| 7,373,668 B1 | 5/2008 | Trimberger | |
| 2005/0289355 A1* | 12/2005 | Kitariev et al. | 713/182 |
| 2006/0282734 A1* | 12/2006 | Milne et al. | 714/742 |

OTHER PUBLICATIONS

Altera SignalTap Embedded Logic Analyzer Megafunction Data Sheet, Apr. 2001, Ver. 2.0, p. 6.
Xilinx ChipScope Pro 10.1, Software and Cores User Guide, US029 (v10.1) Mar. 24, 2008, p. 20.

* cited by examiner

*Primary Examiner* — Vibol Tan
*Assistant Examiner* — Dylan White
(74) *Attorney, Agent, or Firm* — Venable LLP; Robert S. Babayi

(57) ABSTRACT

An improved configuration for a programmable logic device and an improved method for configuration of a programmable logic device are provided. A programmable logic device such as field programmable logic device is configured to include an application logic, an embedded test logic that monitors the application logic, and an access control logic that grants access to an external device to embedded test data provided that an access control requirement is met that is based upon a key stored in a memory and information received from the external device.

18 Claims, 17 Drawing Sheets

PROGRAMMABLE LOGIC DEVICE HAVING AN EMBEDDED TEST LOGIC WITH SECURE ACCESS CONTROL

GOVERNMENT RIGHTS

This invention was made with Government support under W31P4Q-05-A-0031 awarded by US Army Aviation and Missile Command. The Government has certain rights in the invention.

FIELD OF THE INVENTION

This invention generally relates to the field of programmable logic devices and more particularly to the protection of embedded test data after configuration of such devices.

BACKGROUND OF THE INVENTION

A programmable logic device (PLD) is an electronic component used to build configurable digital circuits. Unlike a logic gate, which has a fixed function, a PLD has an undefined function at the time of manufacture. Before the PLD can be used in a circuit it must be programmed (i.e., configured). One variant of a PLD is a field programmable gate array (FPGA), which uses a grid of logic gates. The programming or configuration of the FPGA is done by a user, not by the manufacturer.

FIG. 1 shows a prior art configuration 100 for a programmable logic device (PLD) 10 such as an FPGA. The PLD 10 includes programmable logic 11, also known as an application logic, which typically comprises (1) logic blocks (2) routing lines and programmable interconnection points for routing signals around the PLD 10, and (3) input/output blocks for driving signals between the routing lines and the external pins of the PLD. The logic block contains a lookup table and combinatorial logic function generators as well as flip flops for storing lookup table outputs and other values, and multiplexers and logic gates for enhancing the logic ability of the programmable logic.

The PLD 10 also includes a configuration memory 12, e.g., a static random access memory (RAM), for turning on routing transistors, controlling multiplexers, storing lookup tables and controlling the input/output blocks, all of this for the purpose of configuring the PLD to perform the functionality desired by the designer(s). Bus 16 connects configuration memory 12 to programmable logic 11 and is typically a distributed set of control lines located throughout the PLD. Some Xilinx products (e.g. XC6200) have included a bus 17 by which programmable logic 11 causes a configuration logic 14 to send programming information to configuration memory 12. A bus 18 allows communication between the configuration logic block 14 and the configuration memory 12. In particular, it carries addresses to select configuration frames in memory 12, control signals to perform write and read operations, and data for loading into configuration memory 12 or reading back from configuration memory 12. The configuration logic 14 also responds to a configuration bitstream from an external source 15 on configuration access port 21. The bitstream on configuration access port 21 is treated as words, for example 32-bit words. Several of the words, usually at or near the beginning of the bitstream, are used for setting up the configuration process and include, for example, length of a configuration memory frame, and starting address for the configuration data. One such a structure is described by Kean in U.S. Pat. No. 5,705,938.

PLD 10 further includes a Joint Test Action Group (JTAG) logic block 13 for interfacing with a JTAG port 20 that allows for testing the board in which the PLD is placed. The JTAG logic block 13 implements the IEEE standard 1532, which is a superset of the IEEE standard 1149.1. JTAG allows debugging of a design at the board level. The configuration logic 14 also interfaces with the JTAG logic block 13 through a bus 19, which allows communication between the configuration logic 14 and JTAG logic block 13 so that the JTAG port can be used as another configuration access port. The configuration logic block 14 receives instructions and data, and processes the data according to the instructions. These instructions come into configuration logic 14 as a bitstream. An instruction, or header, is usually followed by data to be acted upon.

The configuration logic 14 typically performs a cyclic redundancy check on a configuration bitstream coming in (see Erickson, U.S. Pat. No. 5,321,704 incorporated herein by reference), reads header bits indicating the frame length of the part being configured and the word count of the configuration data, reads address instructions identifying where to load configuration data, collects frames of configuration data and loads them into columns of configuration memory 12 indicated in the addresses. The configuration logic 14 also controls the readback of configuration data and flip flop values from configuration memory 12 to an external location. In a Virtex FPGA available from Xilinx, Inc., the readback can be done through either a JTAG port 20 or through a configuration access port 21. The configuration logic 14 can also receive configuration data from the programmable logic 11. Prior art PLD configurations in which part of the PLD configures another part of the PLD are disclosed in Kean, U.S. Pat. No. 5,705,938 and Young et al., U.S. Pat. No. 5,914,616, which are both incorporated herein by reference.

Because the PLD 10 is configured by data stored in configuration memory 12 that must be loaded on power-up, the privacy of the design can easily be violated by an attacker who monitors the data on the configuration access port 21, e.g. by putting probes on board traces.

FIG. 2 shows a block diagram of a prior art PLD configuration having a decryption capability. As with the PLD 10 of FIG. 1, the PLD 10 of FIG. 2 is configured by a static RAM memory that must be loaded on power-up. However, with the PLD 10 of FIG. 2, the configuration data is protected as it is being loaded into the device by encrypting the configuration data. The data received from the external source 15 is encrypted. The key for decrypting the configuration data is stored in a key memory 23 and is used by a decryptor 24 within the PLD 10 to decrypt the configuration data. The PLD 10 is then configured using the decrypted configuration data. FIG. 2 shows an approach where the key memory 23 is accessed using a bus 25 from the JTAG access port 20. The bus 25 carries data, addresses, and control signals to perform write and read operations and allows programming of the decryption keys from the JTAG port 20. A bus 26 can also be used for programming of the decryption keys from the configuration port 21. The bus 26 carries security data from key memory 23 to configuration logic 29. A bus 27 carries encrypted configuration data from configuration logic 29 to the decryptor 24 and carries decrypted configuration data back to the configuration logic 29. A bus 28 allows the decryptor 24 to access the keys for decrypting data. When the PLD configuration of FIG. 2 is being loaded with encrypted data, an attacker who monitors the bitstream as it is being loaded receives only the encrypted bitstream and cannot learn the user's design by this method.

FIG. 3 depicts a block diagram of a prior art PLD configuration for testing a PLD 10, which is referred to as a unit under test (UUT). For the sake of simplicity, the logic components previously shown and described in FIGS. 1 and 2 for programming the PLD 10 are not shown in FIG. 3. In order to test the PLD 10 according to the prior art, an embedded test logic 302 is created on the PLD The embedded test logic 302 is designed to monitor logic signals of interest 304 of an application logic 11 that typically interfaces with one or more external devices 306. As depicted in FIG. 3, the PLD 10 also includes a JTAG port 20 that provides an interface to a computer/logic analyzer 308 for controlling and receiving output from embedded test logic 302 over bus 310. The embedded test data pertaining to the monitored signals of interest 304 is stored in a local storage 312. A user of a display/keyboard 314 attached to the computer/logic analyzer 308 can examine the embedded test data stored in the local storage 312. Users of other computers connected to the computer/logic analyzer 308 via a network 316 can also access the embedded test data stored in local storage 312. An optional access control layer 318 can be implemented that involves user access control via passwords and may involve encryption or other protection of the embedded test data.

According to the prior art approach, once the testing is complete, the embedded test logic 302 is removed from the PLD 10, as depicted in FIG. 4, to allow the PLD 10 to function for its intended purpose without the embedded test logic 302, thereby preventing an attacker from learning about the PLD 10 functionality based on embedded test data. The removal of the embedded test logic 302, however, changes the PLD's circuit level design, thereby invalidating verification and validation results from the testing of the PLD 10.

Therefore, there exists a need for PLD configurations that operate as intended while maintaining their validation and verification testing status.

SUMMARY OF THE INVENTION

Briefly, the present invention is an improved PLD configuration and method for configuring a PLD that provides secure access control to embedded test logic output signals. The invention involves a PLD configured to include application logic, embedded test logic that monitors the application logic, and an access control logic that grants or denies access to embedded test logic output signals based upon a stored access key and data received from an external device.

In accordance with a first embodiment of a PLD configuration of the present invention, the PLD configuration includes an application logic, an embedded test logic that monitors the application logic to produce embedded test data, a memory for storing an access key, and an access control logic that grants an external device access to the embedded test data based upon the stored access key and data received from the external device.

In accordance with a second embodiment of a PLD configuration of the present invention, the first embodiment of a PLD configuration of the present invention is modified to also include a decryption logic that decrypts encrypted data received from the external device. Under one arrangement, the stored access code is used to decrypt the encrypted data. Under another arrangement, a different code is used to decrypt the encrypted data.

In accordance with a third embodiment of a PLD configuration of the present invention, the second embodiment of a PLD configuration of the present invention is modified to also include encryption logic for encrypting the embedded test data. Under one arrangement, the stored access code is used to encrypt the embedded test data. Under another arrangement, a different code is used to encrypt the embedded test data.

In accordance with a fourth embodiment of a PLD configuration of the present invention, the third embodiment of a PLD configuration of the present invention is modified to remove the decryption logic.

In accordance with a fifth embodiment of a PLD configuration of the present invention, the third embodiment of a PLD configuration of the present invention is modified to also include a health monitor logic and a second memory. The health monitor logic compares actual embedded test logic values to normal embedded test logic values stored in the second memory and provides an encrypted warning to an external device when actual embedded test logic values are determined to be unacceptable based on an established acceptance criteria. Under one arrangement, the stored access code is used to encrypt the warning. Under another arrangement, a different code is used to encrypt the warning.

In accordance with a sixth embodiment of a PLD configuration of the present invention, the fourth embodiment of a PLD configuration of the present invention is modified to also include the health monitor logic and second memory.

In accordance with one aspect of the present invention, an external device can interface with the PLD using at least one of a Joint Test Action Group port, a configuration access port, or an input/output port.

In accordance with another aspect of the present invention, a PLD configuration can include a Joint Test Action Group logic, where the access control logic provides an access control layer between the Joint Test Action Group logic and the embedded test logic.

In accordance with a first embodiment of a method of the present invention, the configuration of a PLD includes the steps of creating on the programmable logic device an application logic, creating on the programmable logic device an embedded test logic that monitors the application logic to produce embedded test data, and creating on the programmable logic device an access control logic that grants an external device access to the embedded test data based upon an access key stored in a memory and data received from the external device.

In accordance with a second embodiment of a method of the present invention, the first embodiment of the configuration of a PLD is modified to also include the step of creating on the programmable logic device a decryption logic that decrypts encrypted data received from the external device. Under one arrangement, the access key used to grant access is also used to decrypt the encrypted data. Under another arrangement, a different key is used to decrypt the encrypted data.

In accordance with a third embodiment of a method of the present invention, the second embodiment of the configuration of a PLD is modified to replace its third step with the steps of creating on the programmable logic device encryption logic that encrypts the embedded test data and creating on the programmable logic device an access control logic that grants an external device access to the embedded test data based upon an access key stored in a memory and data received from the external device. Under one arrangement, the access key used to grant access is also used to encrypt the embedded test data and to decrypt the encrypted data. Under another arrangement, a different key is used to encrypt the embedded test data and to decrypt the encrypted data.

In accordance with a fourth embodiment of a method of the present invention, the third embodiment of the configuration of a PLD is modified to remove the step of creating on the programmable logic device decryption logic.

In accordance with a fifth embodiment of a method of the present invention, the first embodiment of the configuration of a PLD is modified to remove the last step which is replaced by the steps of creating on the programmable logic device a health monitor logic for monitoring actual values of the embedded test data relative to normal embedded test data values stored in a second memory and for providing a warning when the actual values are unacceptable, creating on the programmable logic device encryption logic that encrypts the embedded test data and the warning, and creating on the programmable logic device an access control logic that grants an external device access to the encrypted embedded test data and the encrypted warning based upon an access key stored in a memory and data received from the external device. Under one arrangement, the access key used to grant access is also used to encrypt the embedded test data and the warning. Under another arrangement, a different key is used to encrypt the embedded test data and the warning.

In accordance with a sixth embodiment of a method of the present invention, the fifth embodiment of the configuration of a PLD is modified to include the step of creating on the programmable logic device a decryption logic that decrypts encrypted data received from the external device. Under one arrangement, the access key used to grant access is also used to decrypt the encrypted data received from the external device. Under another arrangement, a different key is used to decrypt the encrypted data received from the external device.

In accordance with a seventh embodiment of a method of the present invention, the fifth embodiment of the configuration of a PLD is modified to remove the last two steps which are replaced by the steps of creating on the programmable logic device encryption logic that encrypts the warning and creating on the programmable logic device an access control logic that grants an external device access to the encrypted warning based upon an access key stored in a memory and data received from the external device.

In accordance with a further aspect of the invention, a method for configuration of a PLD can include the step of creating on the programmable logic device a Joint Test Action Group logic, where the access control logic provides an access control layer between the Joint Test Action Group logic and the embedded test logic.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art. Like numbers refer to like elements throughout.

Figure 5:
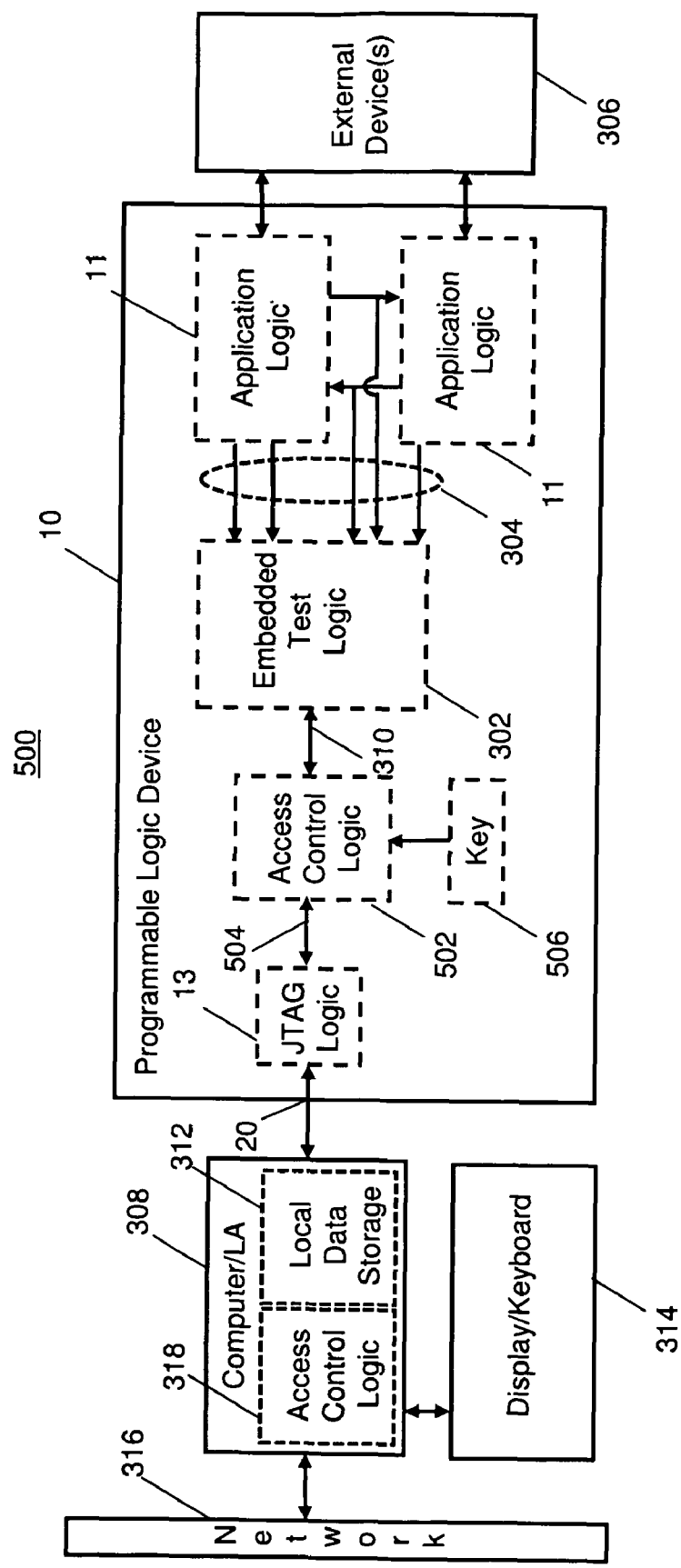
FIG. 5 depicts an exemplary PLD configuration in accordance with a first embodiment of a PLD configuration of the present invention.

FIG. 5 depicts an exemplary PLD configuration 500 in accordance with a first embodiment of a PLD configuration of the present invention. An access control logic 502 created on a PLD 10 controls access to embedded test logic 302. The access control logic 502 interfaces with JTAG logic 13 via a bus 504. Under one arrangement, an external device, such as a tester, logic analyzer, waveform/signal analyzer, etc., can interface with the embedded test logic 302 through the access control logic 502. The JTAG logic 13 comprises an interface port 20 for communication of data between the external analyzer and the embedded test logic 302. The access control logic 502 interfaces with the embedded test logic 302 via a bus 310. According to the invention, the JTAG logic 13 cannot access the output of the embedded test logic 302 unless an access control requirement of the access control logic 502 is met, for example a hash operation on a user supplied data matching an internally stored access code (or key) 506. The access code 506 can be stored in a suitable storage logic or device. One skilled in the art will recognize that any of various well known access control techniques can be employed to provide an access control logic 502 between the JTAG port 21 and embedded test logic 302 of a PLD 10 in accordance with the present invention.

Figure 1:
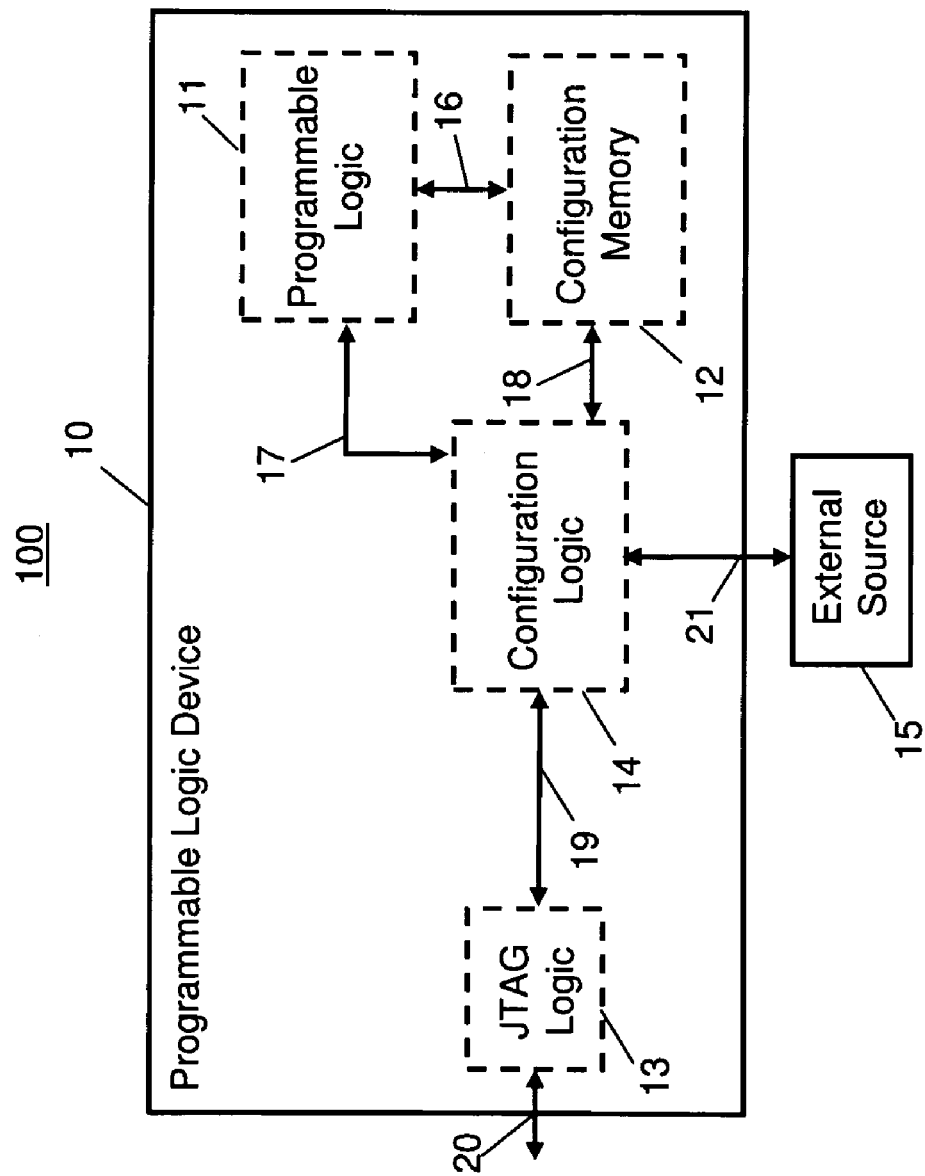
FIG. 1 shows a prior art configuration for a PLD such as an FPGA.
Figure 2:
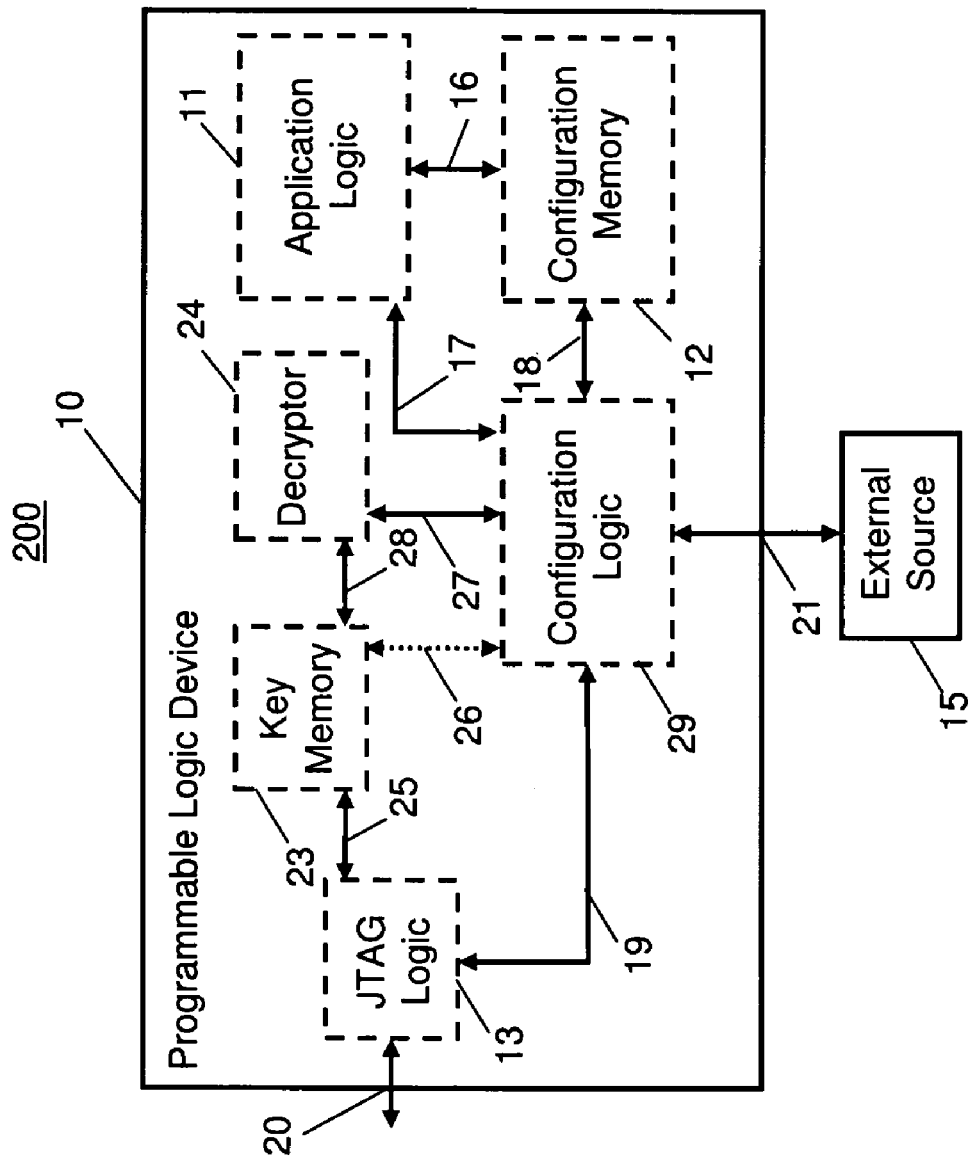
FIG. 2 shows a block diagram of a prior art PLD configuration having a decryption capability.
Figure 3:
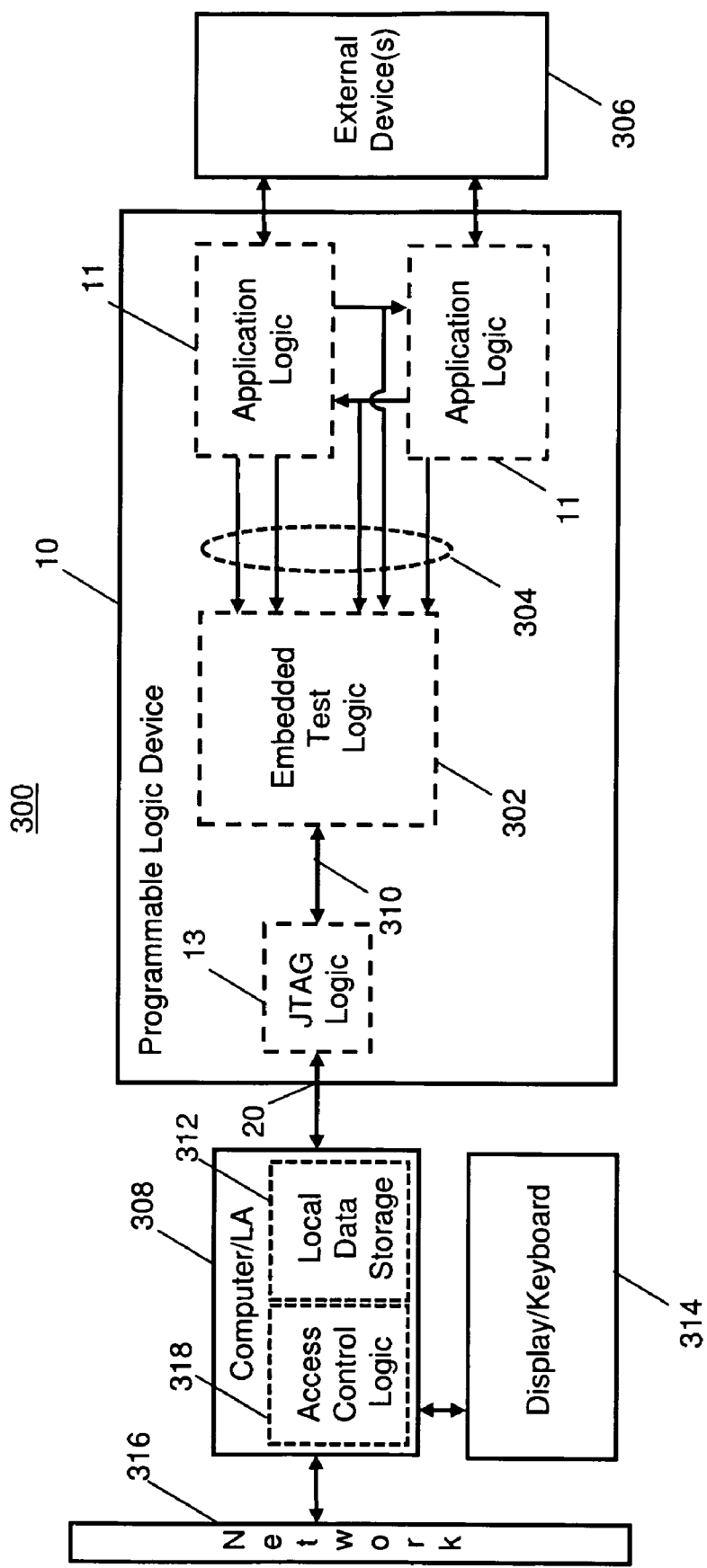
FIG. 3 depicts a block diagram of a prior art PLD configuration for testing a PLD.
Figure 4:
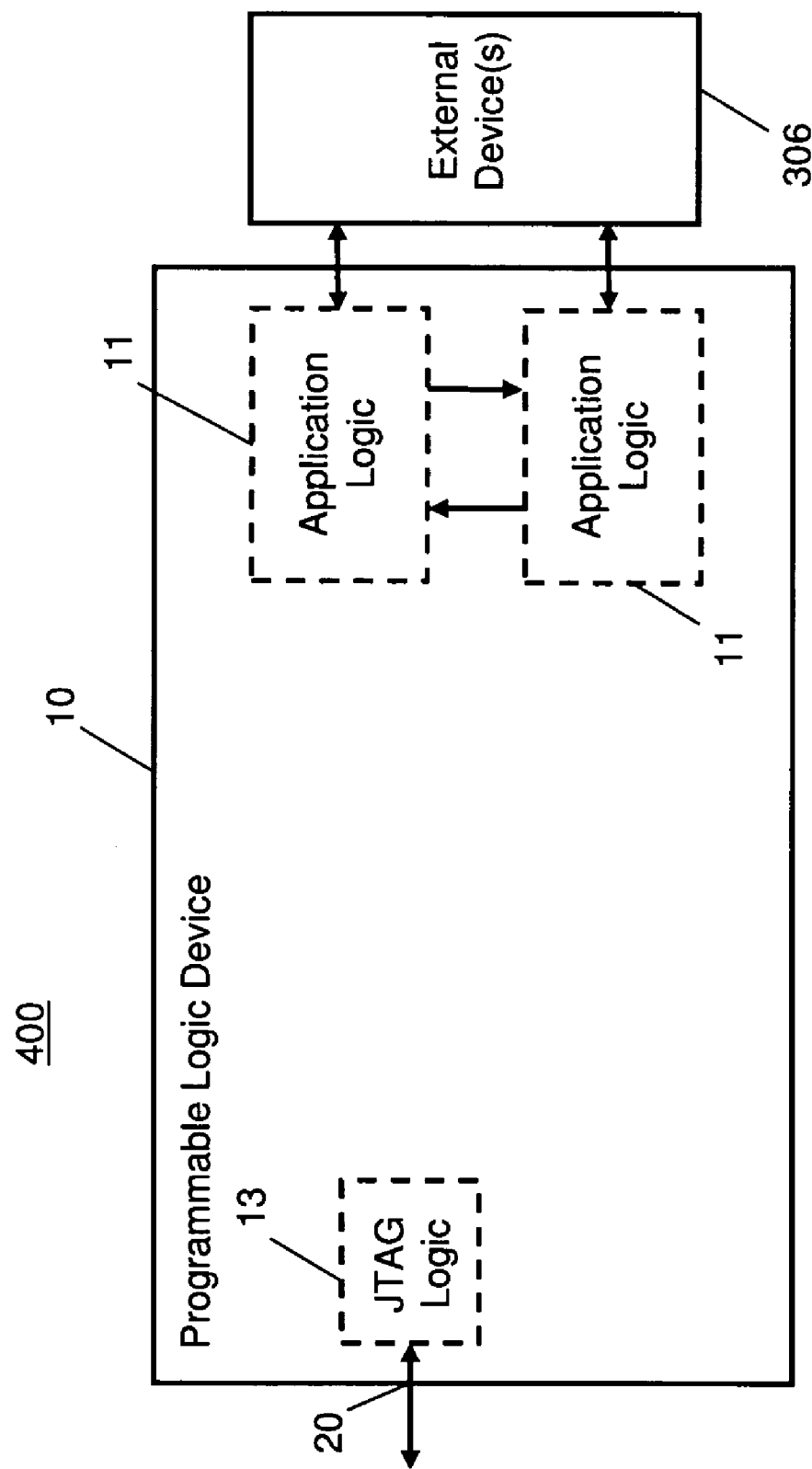
FIG. 4 depicts exemplary prior art removal of embedded test logic after a PLD has been tested.
Figure 6:
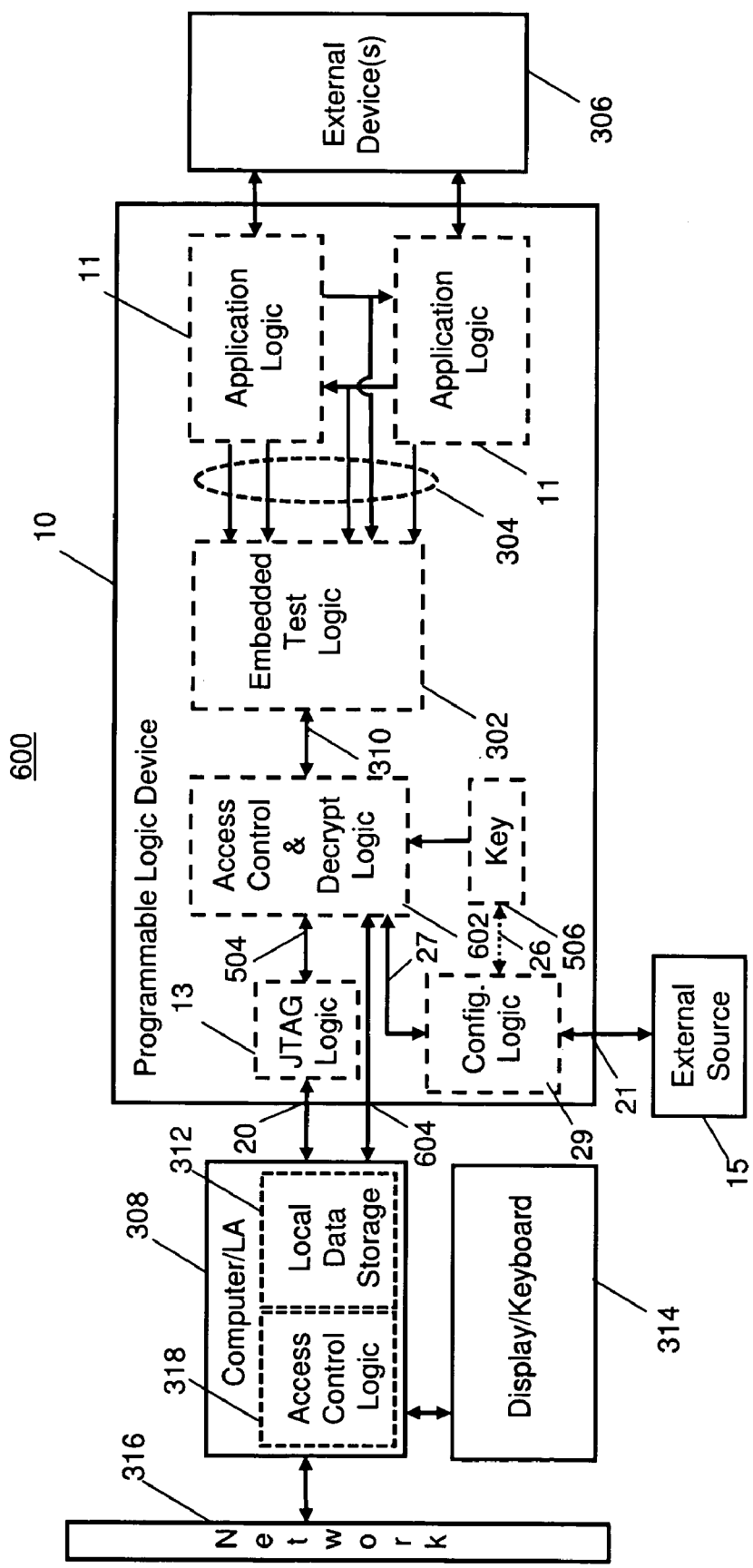
FIG. 6 depicts an exemplary PLD configuration in accordance with a second embodiment of a PLD configuration of the present invention.

FIG. 6 depicts an exemplary PLD configuration 600 in accordance with a second embodiment of a PLD configuration of the present invention. Referring to FIG. 6, access control and decryption logic 602 is placed between the JTAG logic 13 and the embedded test logic 302. As with the exemplary PLD configuration 500 of FIG. 5, a user of the JTAG port 20 cannot access the output 310 of the embedded test logic 302 without meeting access control requirements enforced by the access control and decryption logic 602. Additionally, access control and decryption logic 602 is able to decrypt information it receives from an external port, for example a configuration access port 21 via configuration logic 29 and bus 27 (note that other components used for programming the PLD 10 shown in FIGS. 1 and 2 are present but not depicted). Alternatively, access control and decryption logic 602 may decrypt data received from a computer/logic analyzer 308 via another input/output (I/O) port 604. I/O port 604 might alternatively be connected to a network to include a wired or wireless network or connected to an external storage media where the data would be stored in encrypted form. Decryption can be done using the same key 506 used for access control or using another key(s). One skilled in the art will recognize that any of various well known encryption/decryption techniques can be employed to provide an encrypted vs. non-encrypted layer between the JTAG port 20 and embedded test logic 302 of a PLD 10 in accordance with the present invention.

Figure 7:
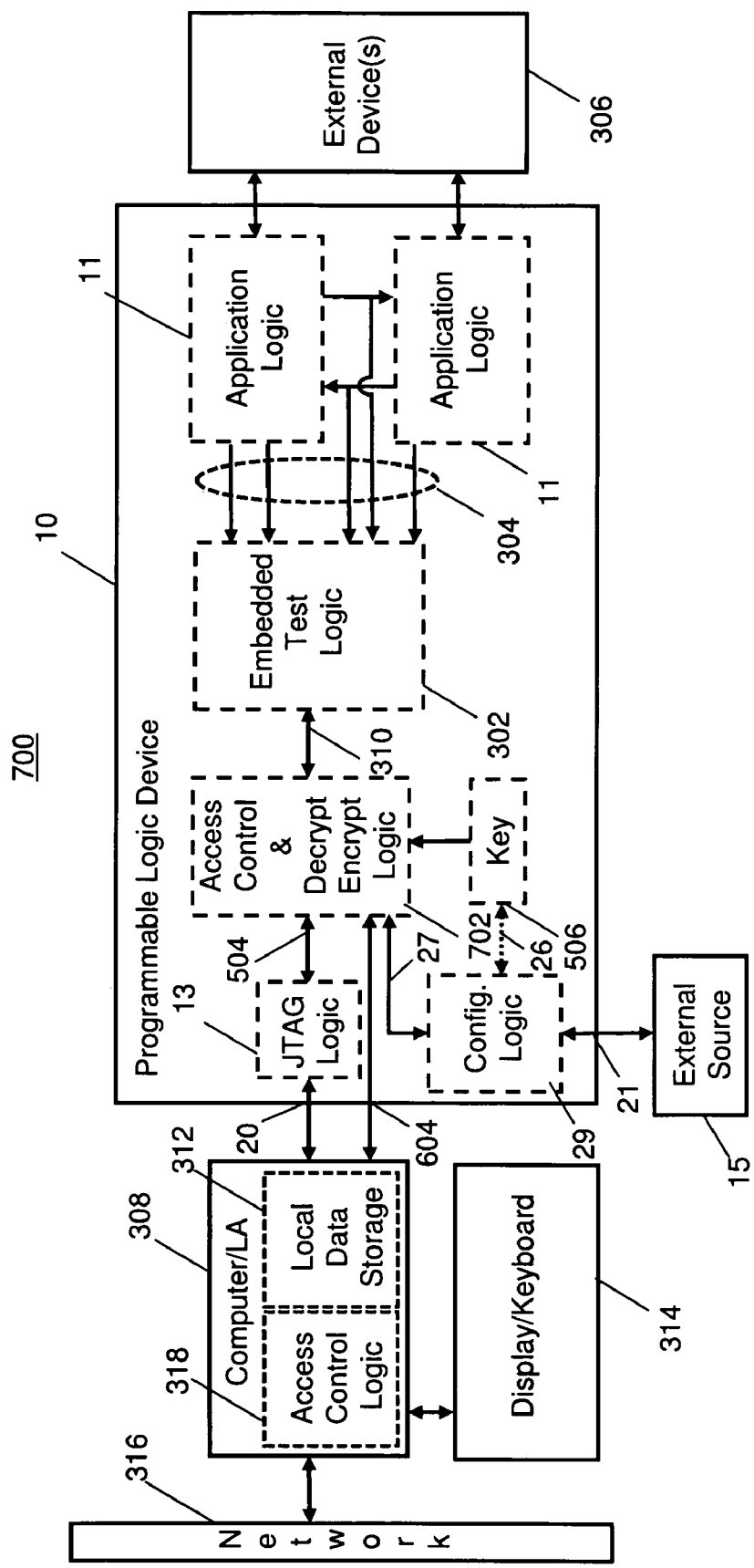
FIG. 7 depicts an exemplary PLD configuration in accordance with a third embodiment of a PLD configuration of the present invention.

FIG. 7 depicts an exemplary PLD configuration 700 in accordance with a third embodiment of a PLD configuration of the present invention. Referring to FIG. 7, the PLD configuration 700 of the third embodiment is the same as the PLD configuration 600 of the second embodiment except that access control and decryption logic 602 is replaced by access control and decryption/encryption logic 702. As such, in addition to the functionality described for the access control and decryption logic 602, the access control and decryption/encryption logic 702 can also encrypt the output of the embedded test logic 302. Encryption and decryption can be done using the same key 506 used for access control or using another key(s). One skilled in the art will recognize that any of various well known encryption/decryption techniques can be employed to provide an encrypted vs. non-encrypted layer between the JTAG port 20 and embedded test logic 302 of a PLD 10 in accordance with the present invention.

Figure 8:
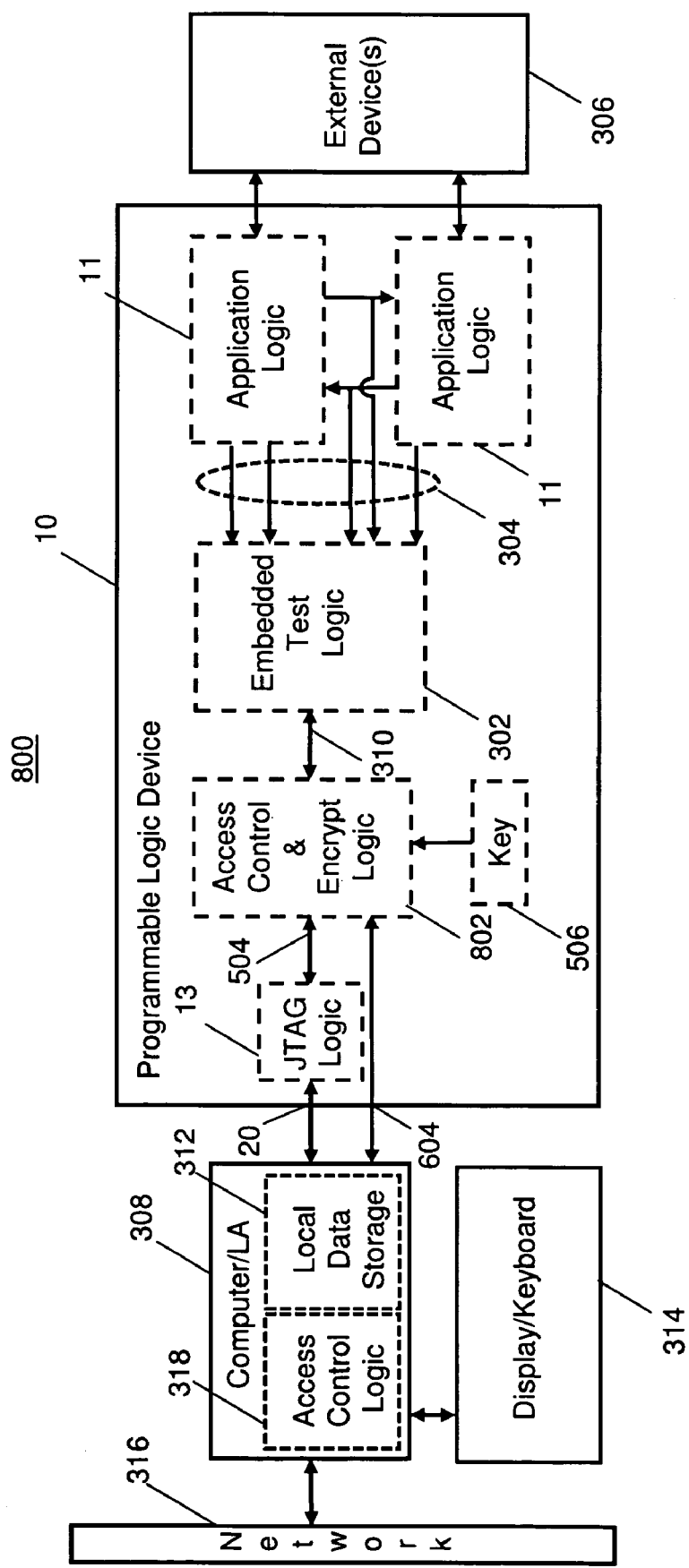
FIG. 8 depicts an exemplary PLD configuration in accordance with a fourth embodiment of a PLD configuration of the present invention.

FIG. 8 depicts an exemplary PLD configuration 800 in accordance with a fourth embodiment of a PLD configuration of the present invention. Referring to FIG. 8, the PLD configuration 800 of the fourth embodiment is the same as the PLD configuration 700 of the third embodiment except that access control and decryption/encryption logic 702 is replaced by access control and encryption logic 802. As such, the functionality of the PLD configuration 800 of the fourth embodiment of the invention is the same as the functionality of the PLD configuration 700 of the third embodiment except it is unable to decrypt information received from an external source.

Figure 9:
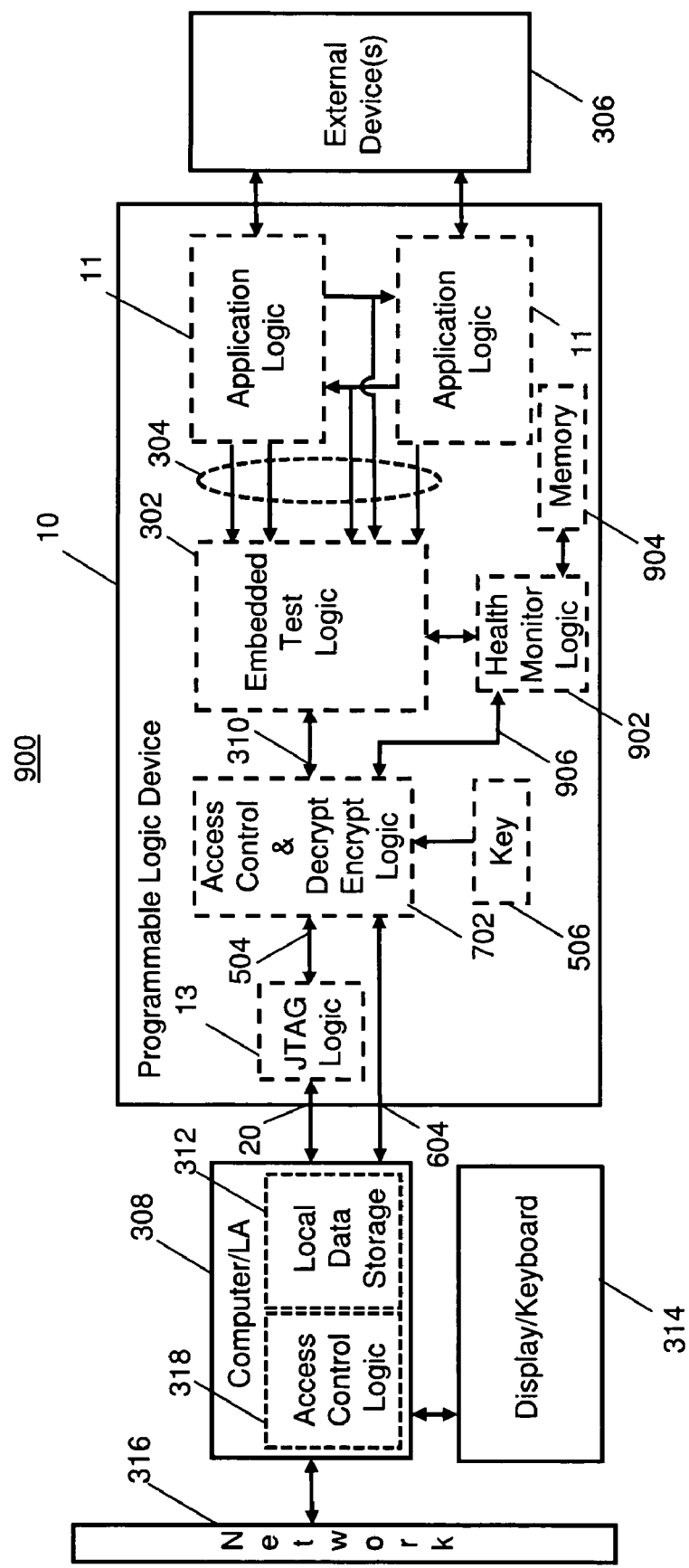
FIG. 9 depicts an exemplary PLD configuration in accordance with a fifth embodiment of a PLD configuration of the present invention.

FIG. 9 depicts an exemplary PLD configuration 900 in accordance with a fifth embodiment of a PLD configuration of the present invention. Referring to FIG. 9, the PLD configuration 900 of the fifth embodiment is the same as the PLD configuration 700 of the third embodiment except it also includes health monitor logic 902 and additional memory 904. The health monitor logic 902 interfaces with embedded test logic 302 and stores in the additional memory 904 expected (or normal) values for signals of interest 304. The health monitor logic 902 provides status signals via a bus 906 to include warnings when actual values of the signals of interest 304 are unacceptable as determined by comparison of the actual values to the expected values based on some established criteria. As depicted, an encrypted health status request may be received from a computer 308 and an encrypted health status report (or warning indication) may be provided via an I/O port 604. Alternatively, access control and decryption/encryption logic 702 can be replaced with access control logic 502 and non-encrypted health status requests and responses can be employed.

Figure 10:
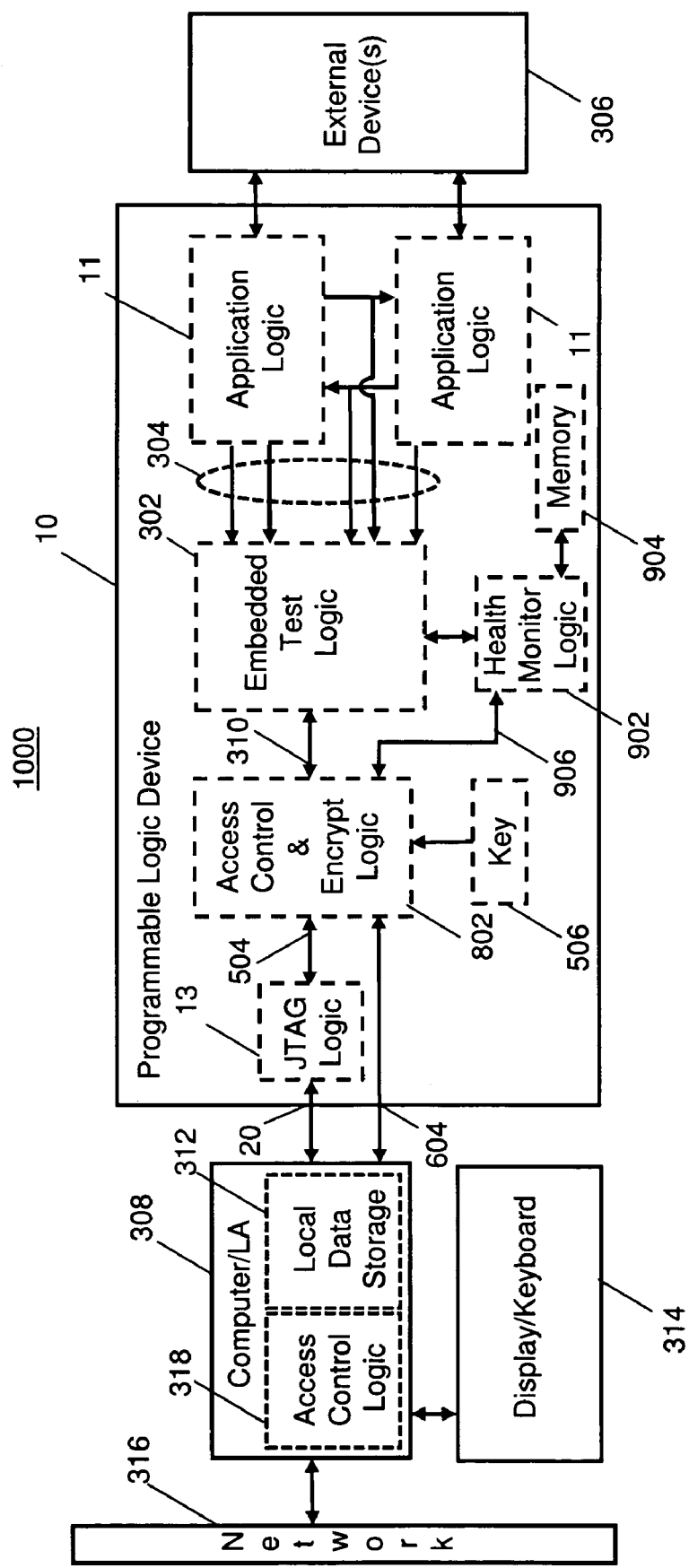
FIG. 10 depicts an exemplary PLD configuration in accordance with a sixth embodiment of a PLD configuration of the present invention.

FIG. 10 depicts an exemplary PLD configuration 1000 in accordance with a sixth embodiment of a PLD configuration of the present invention. Referring to FIG. 10, the PLD configuration 1000 of the sixth embodiment is the same as the PLD configuration 900 of the fifth embodiment except that access control and decryption/encryption logic 702 is replaced by access control and encryption logic 802. As such, the functionality of the PLD configuration 1000 of the sixth embodiment of the invention is the same as the functionality of the PLD configuration 900 of the fifth embodiment except it is unable to decrypt information received from an external source.

FIGS. 11 through 17 depict various exemplary methods for PLD configuration each having various steps. One skilled in the art will recognize that the steps of the methods, for the most part, can be rearranged. As such, their order should not be construed as limiting the invention.

Figure 11:
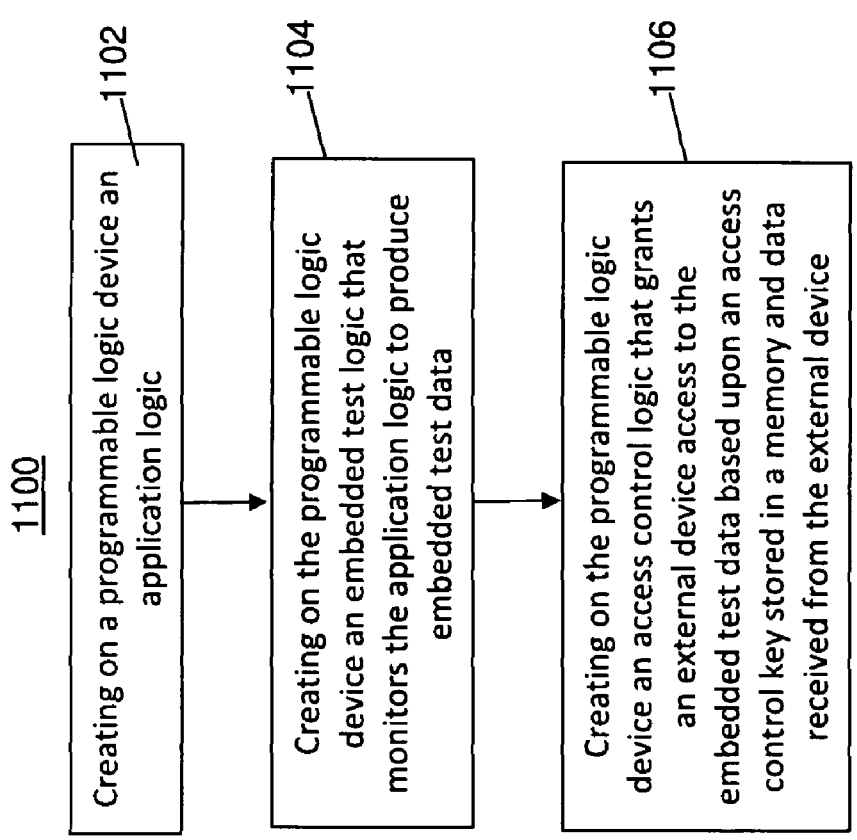
FIG. 11 depicts an exemplary method for PLD configuration in accordance with a first embodiment of a method for PLD configuration of the present invention.

FIG. 11 depicts an exemplary method for PLD configuration 1100 in accordance with a first embodiment of a method for PLD configuration of the present invention. Referring to FIG. 11, the method for PLD configuration 1100 includes a first step 1102 of creating on a programmable device an application logic, a second step 1104 of creating on the programmable logic device an embedded test logic that monitors the application logic to produce embedded test data, and a third step 1106 of creating on the programmable logic device an access control logic that grants an external device access to the embedded test data based upon an access control key stored in a memory and data received from the external device.

Figure 12:
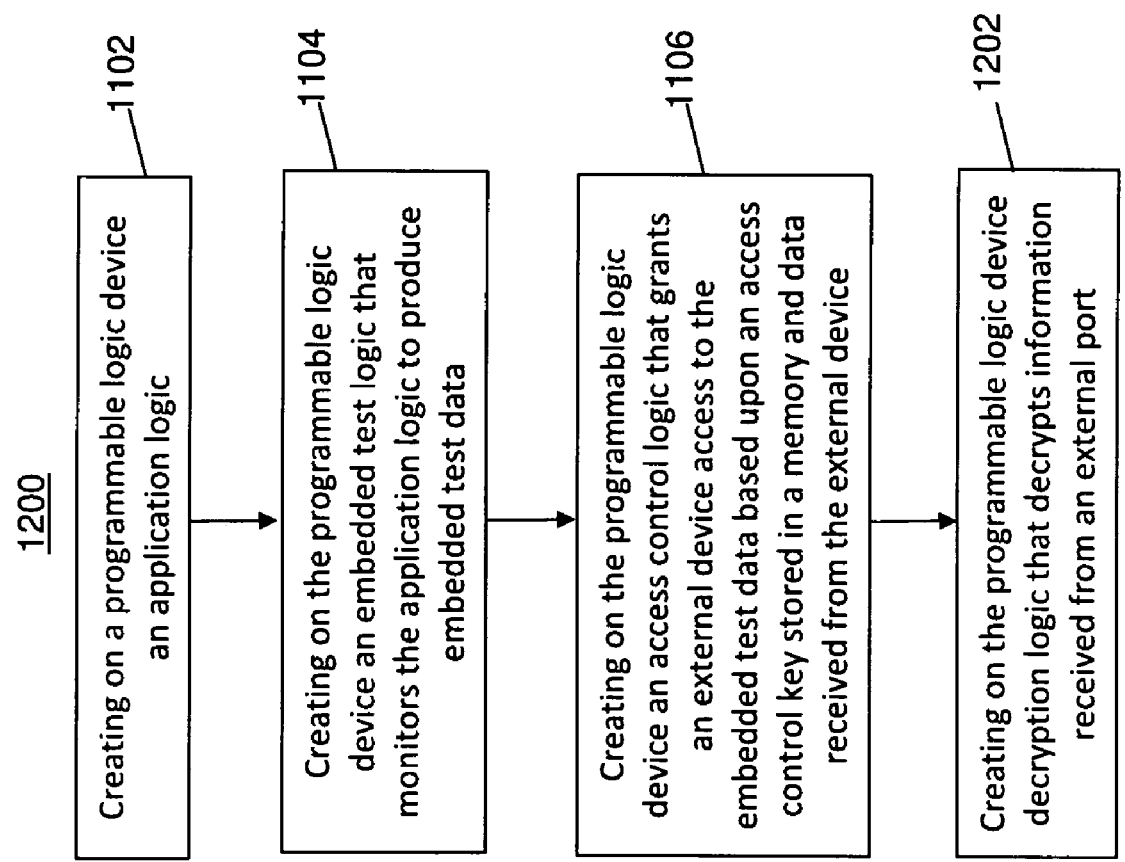
FIG. 12 depicts an exemplary method for PLD configuration in accordance with a second embodiment of a method for PLD configuration of the present invention.

FIG. 12 depicts an exemplary method for PLD configuration 1200 in accordance with a second embodiment of a method for PLD configuration of the present invention. Referring to FIG. 12, the method for PLD configuration 1200 is the same as the method for PLD configuration 1100 of the first embodiment of a method for PLD configuration except an additional step has been added. Specifically, added is a fourth step 1202 of creating on the programmable logic device decryption logic that decrypts information received from an external port.

Figure 13:
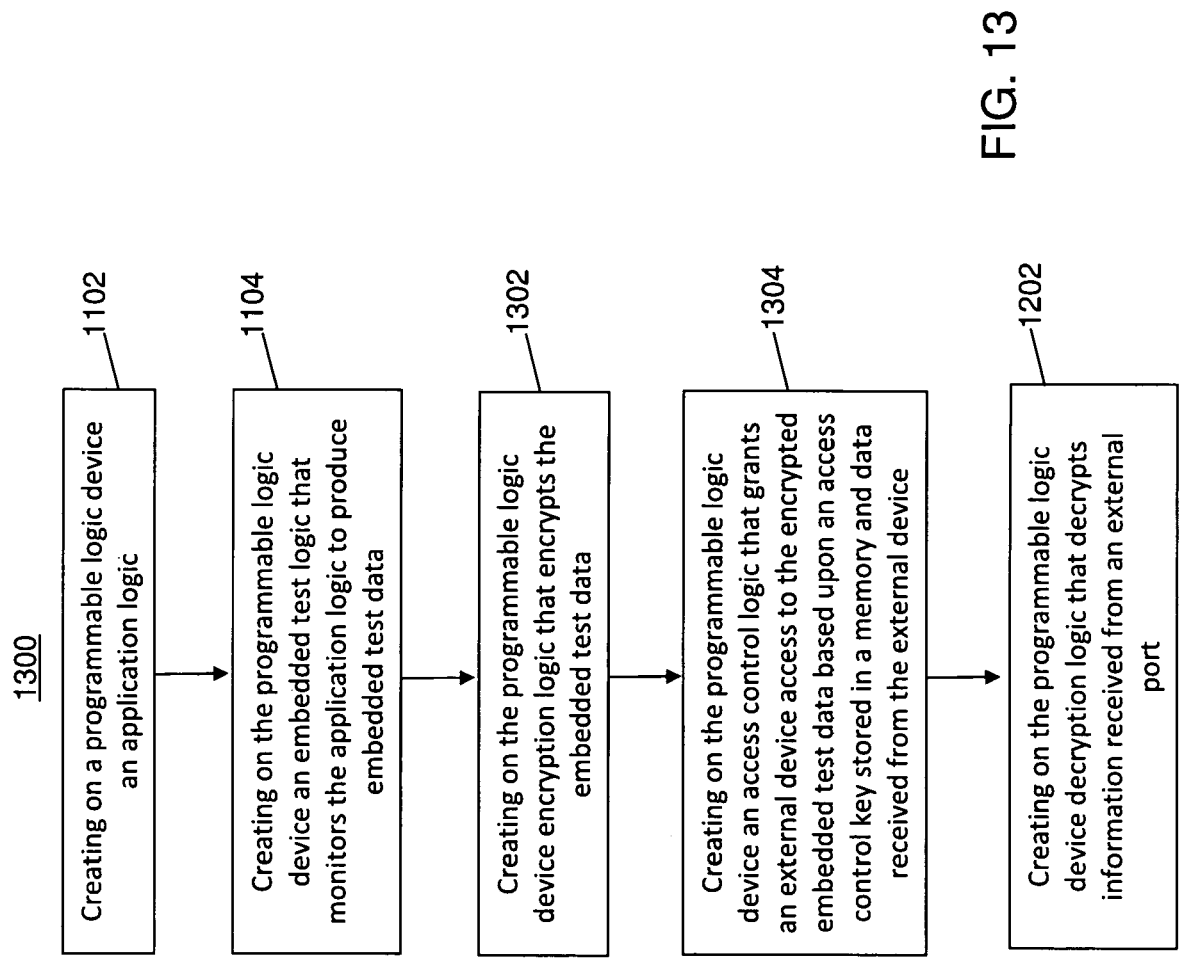
FIG. 13 depicts an exemplary method for PLD configuration in accordance with a third embodiment of a method for PLD configuration of the present invention.

FIG. 13 depicts an exemplary method for PLD configuration 1300 in accordance with a third embodiment of a method for PLD configuration of the present invention. Referring to FIG. 13, the method for PLD configuration 1300 is the same as the method for PLD configuration 1200 of the second embodiment of a method for PLD configuration except the third step 1106 has been replaced by two new steps. Added were a step 1302 of creating on the programmable logic device encryption logic that encrypts the embedded test data and another step 1304 of creating on the programmable logic device an access control logic that grants an external device access to the encrypted embedded test data based upon an access control key stored in a memory and data received from the external device.

Figure 14:
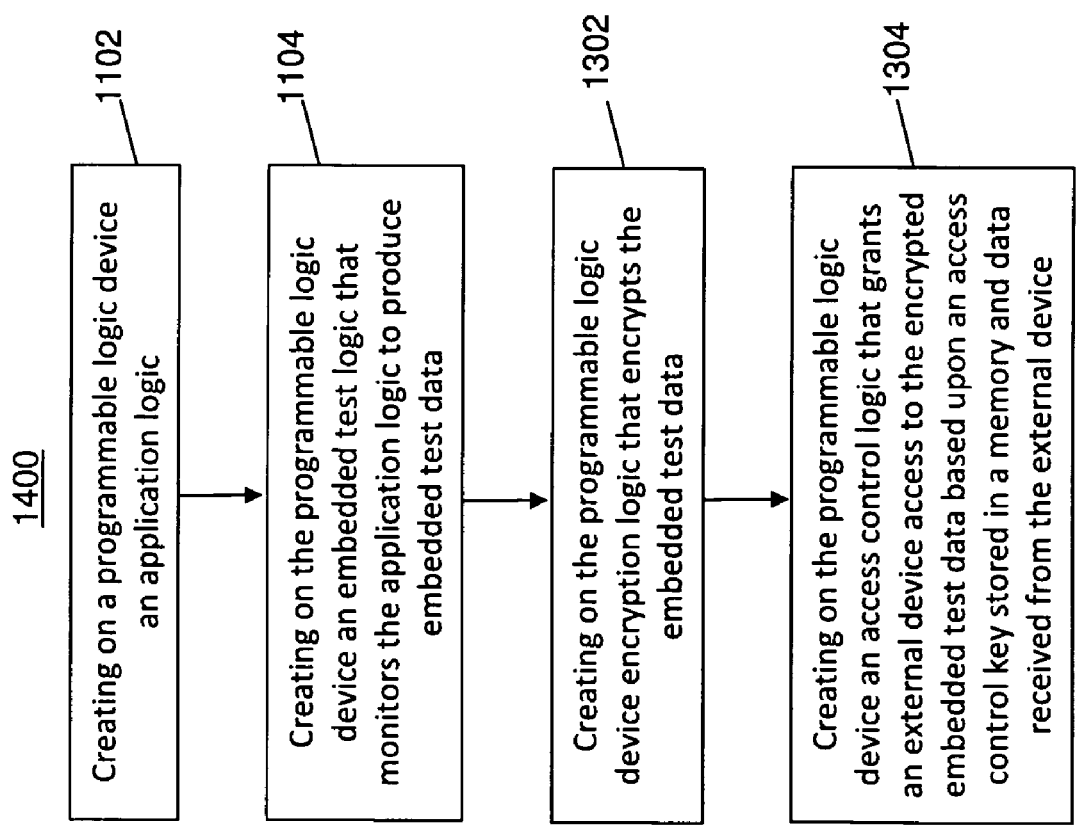
FIG. 14 depicts an exemplary method for PLD configuration in accordance with a fourth embodiment of a method for PLD configuration of the present invention.

FIG. 14 depicts an exemplary method for PLD configuration 1400 in accordance with a fourth embodiment of a method for PLD configuration of the present invention. Referring to FIG. 14, the method for PLD configuration 1400 is the same as the method for PLD configuration 1300 of the third embodiment of a method for PLD configuration except the last step 1202 has been removed.

Figure 15:
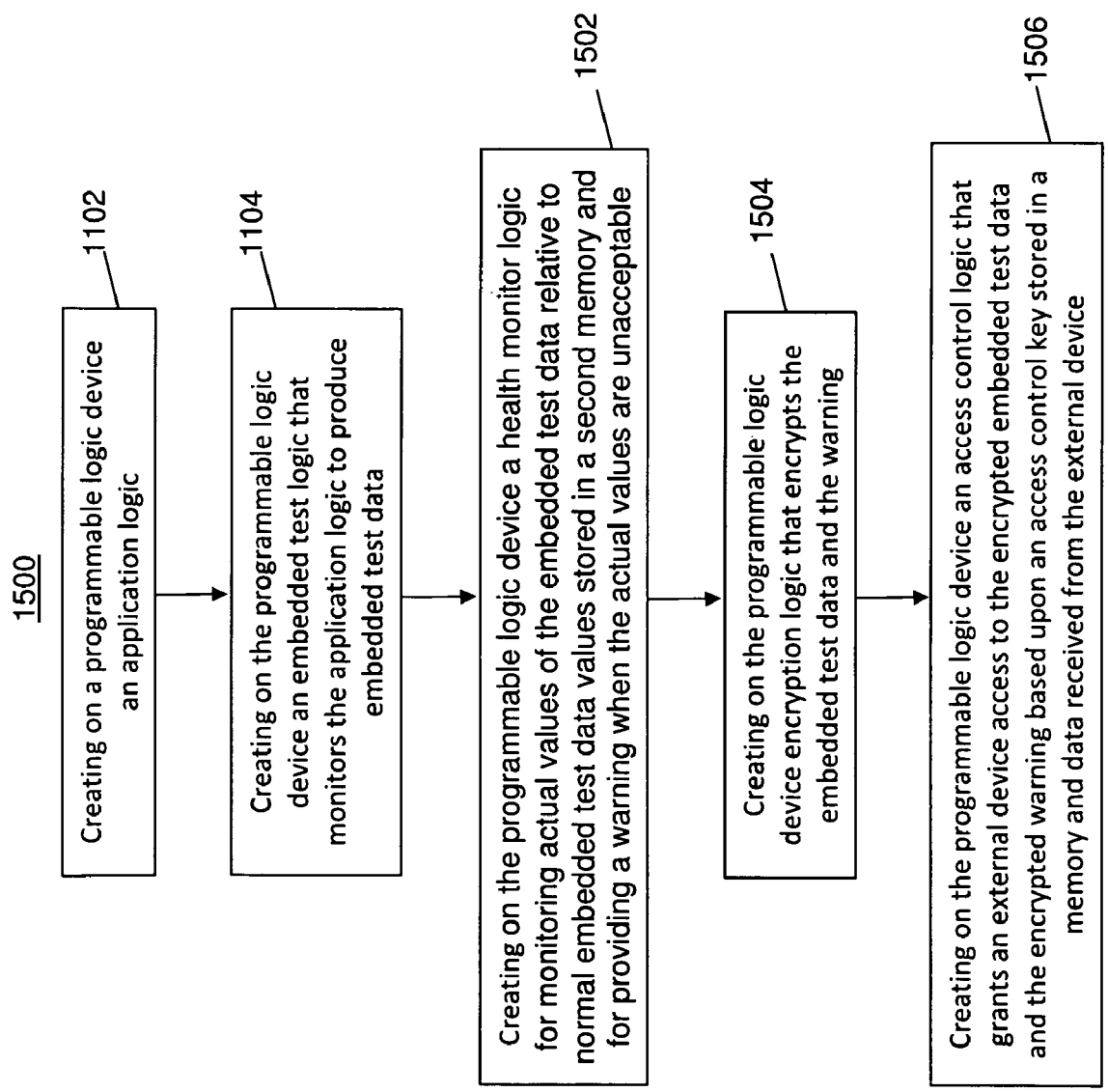
FIG. 15 depicts an exemplary method for PLD configuration in accordance with a fifth embodiment of a method for PLD configuration of the present invention.

FIG. 15 depicts an exemplary method for PLD configuration 1500 in accordance with a fifth embodiment of a method for PLD configuration of the present invention. Referring to FIG. 15, the method for PLD configuration 1500 is the same as the method for PLD configuration 1100 of the first embodiment of a method for PLD configuration except the third step 1106 has been replaced by three new steps. Added were a new third step 1502 of creating on the programmable logic device a health monitor logic for monitoring actual values of the embedded test data relative to normal embedded test data values stored in a second memory and for providing a warning when the actual values are unacceptable, a new fourth step 1504 of creating on the programmable logic device encryption logic that encrypts the embedded test data and the warning, and a new fifth step 1506 of creating on the programmable logic device an access control logic that grants an external device access to the encrypted embedded test data and the encrypted warning based upon an access control key stored in a memory and data received from the external device.

Figure 16:
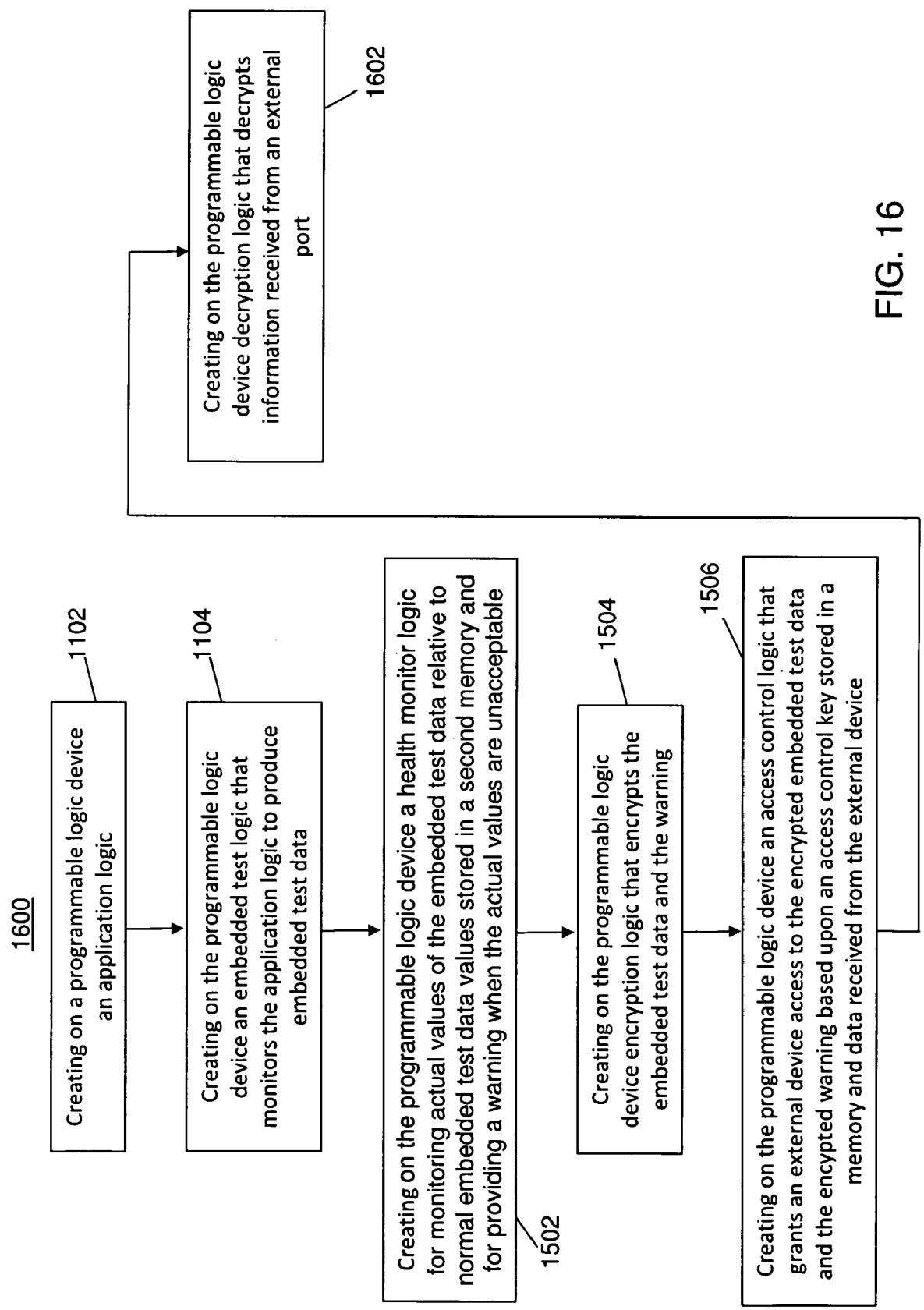
FIG. 16 depicts an exemplary method for PLD configuration in accordance with a sixth embodiment of a method for PLD configuration of the present invention.

FIG. 16 depicts an exemplary method for PLD configuration 1600 in accordance with a sixth embodiment of a method for PLD configuration of the present invention. Referring to FIG. 16, the method for PLD configuration 1600 is the same as the method for PLD configuration 1500 of the fifth embodiment of a method for PLD configuration except for an additional step 1602 of creating on the programmable logic device decryption logic that decrypts information received from an external port.

Figure 17:
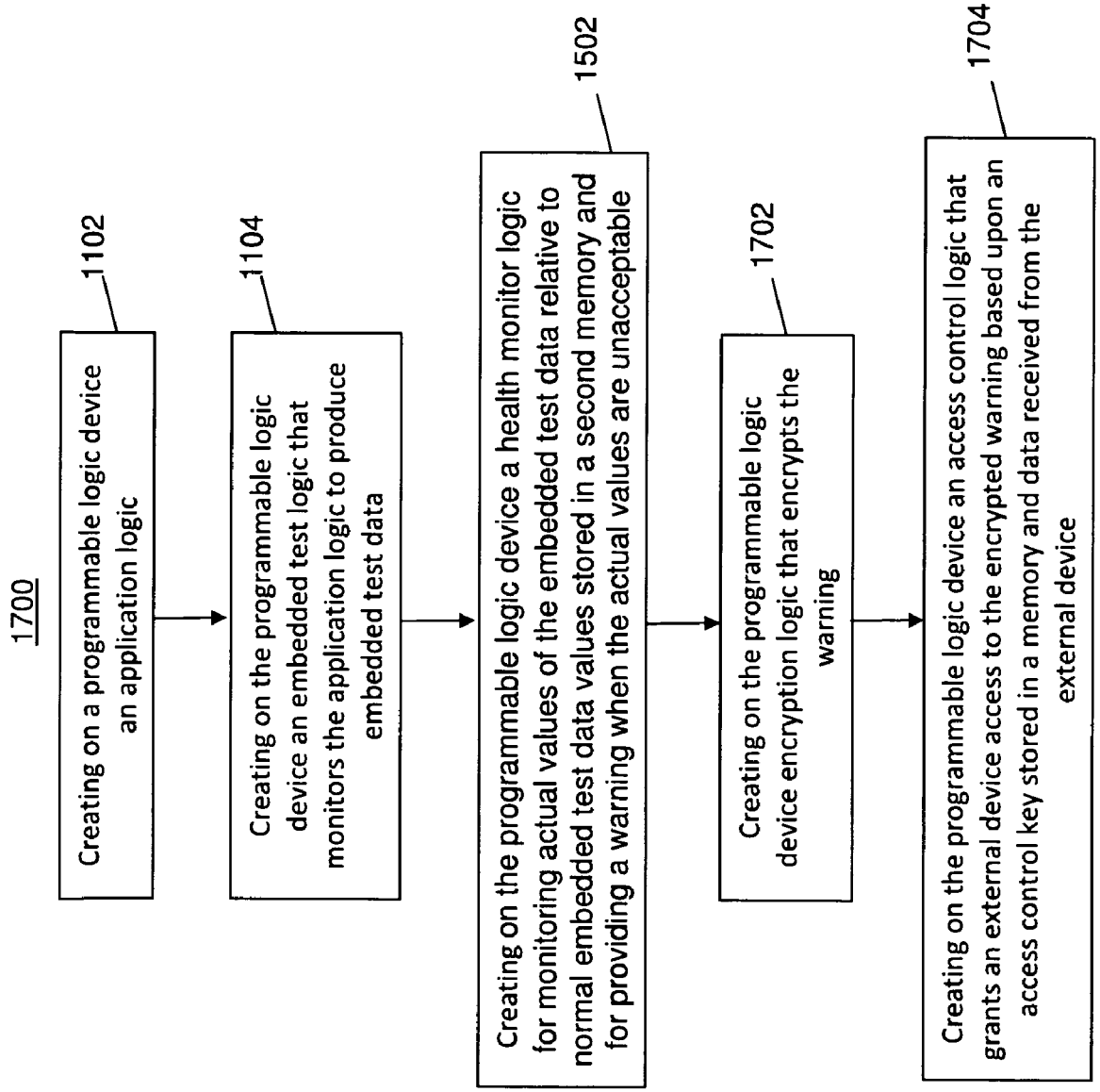
FIG. 17 depicts an exemplary method for PLD configuration in accordance with a seventh embodiment of a method for PLD configuration of the present invention.

FIG. 17 depicts an exemplary method for PLD configuration 1700 in accordance with a seventh embodiment of a method for PLD configuration of the present invention. Referring to FIG. 17, the method for PLD configuration 1700 is the same as the method for PLD configuration 1500 of the fifth embodiment of a method for PLD configuration except the last two steps 1504, 1506 are replaced by two new steps. Added were a step 1702 of creating on the programmable logic device encryption logic that encrypts the warning and another step 1704 of creating on the programmable logic device an access control logic that grants an external device access to the encrypted warning based upon an access control key stored in a memory and data received from the external device.

The present invention can be used with various types of PLDs other than FPGAs. Such PLDs include programmable array logic (PAL) devices, generic array logic (GAL) devices, programmable electrically erasable logic (PEEL) devices, complex PLD (CPLD) devices and other such devices.

The present invention can be implemented using any of various well known hardware description languages (HDLs) such as Verilog or Very-High-Speed Integrated Circuit HDL.

The present invention enables PLDs to be tested under a verification and validation process where the results of the testing remain valid after testing. The design of the PLD remains secure after testing and embedded test data can be made readily available at any time with the entry of a correct access code. Moreover, PLDs having secure health monitoring capabilities can provide for improved safety and maintenance of all sorts of control systems involving PLDs such as those in aircraft, vehicles, military equipment, ships, missile systems, robots, environment control systems, and various other systems that use them.

While particular embodiments of the invention have been described, it will be understood, however, that the invention is not limited thereto, since modifications may be made by those skilled in the art, particularly in light of the foregoing teachings.

The invention claimed is:

1. A programmable logic device configuration comprising:
an application logic;
an embedded test logic that monitors the application logic to produce embedded test data;
a first memory for storing an access key;
an access control logic that grants an external device access to said embedded test data based upon the stored access key and data received from the external device;
a second memory for storing normal embedded test data values; and
a health monitor logic for monitoring actual values of said embedded test data relative to said normal embedded test data values.

2. The programmable logic device configuration of claim 1, further comprising:
a decryption logic, said decryption logic decrypting encrypted data received from said external device.

3. The programmable logic device configuration of claim 2, wherein said stored access code is used to decrypt said encrypted data.

4. The programmable logic device configuration of claim 1, further comprising:
an encryption logic, said encryption logic encrypting said embedded test data.

5. The programmable logic device configuration of claim 4, wherein said stored access code is used to encrypt said embedded test data.

6. The programmable logic device configuration of claim 1, wherein said external device interfaces with said programmable logic device using at least one of a Joint Test Action Group port, a configuration access port, or an input/output port.

7. The programmable logic device configuration of claim 1, further comprising:
a Joint Test Action Group logic.

8. The programmable logic device configuration of claim 7, wherein said access control logic provides an access control layer between said Joint Test Action Group logic and said embedded test logic.

9. The programmable logic device configuration of claim 1, wherein said health monitor logic provides a warning to said external device when said actual values of said embedded test data are determined to be unacceptable when compared to said normal embedded test data values.

10. A method for programming a configuration of a programmable logic device comprising the steps of:
creating on the programmable logic device an application logic;
creating on the programmable logic device an embedded test logic that monitors the application logic to produce embedded test data; and
creating on the programmable logic device an access control logic that grants an external device access to said embedded test data based upon an access key stored in a memory and data received from the external device; and
creating on the programmable logic device a health monitor logic for monitoring actual values of said embedded test data relative to normal embedded test data values stored in a second memory.

11. The method of claim 10, further comprising the step of:
creating on the programmable logic device a decryption logic, said decryption logic decrypting encrypted data received from said external device.

12. The method of claim 11, wherein said decryption logic uses said stored access code to decrypt said encrypted data.

13. The method of claim 10, further comprising:
   creating on the programmable logic device an encryption logic, said encryption logic encrypting said embedded test data.

14. The method of claim 13, wherein said encryption logic uses said stored access code to encrypt said embedded test data.

15. The method of claim 10, further comprising:
   creating on the programmable logic device a Joint Test Action Group logic.

16. The method of claim 15, wherein said access control logic provides an access control layer between said Joint Test Action Group logic and said embedded test logic.

17. The method of claim 10, wherein said health monitor logic provides a warning to said external device when said actual values of said embedded test data are determined to be unacceptable when compared to said normal embedded test data values.

18. The method of claim 17, further comprising:
   creating on the programmable logic device an encryption logic, said encryption logic encrypting said warning.

* * * * *